(12) United States Patent
Bollenbeck et al.

(10) Patent No.: US 7,504,883 B2
(45) Date of Patent: Mar. 17, 2009

(54) AMPLIFIER DEVICE INCLUDING AN OPERATIONAL AMPLIFIER, TRANSFORMER AND FEEDBACK LOOP

(75) Inventors: Jan Bollenbeck, Eggolsheim (DE); Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 106 days.

(21) Appl. No.: 11/674,254

(22) Filed: Feb. 13, 2007

(65) Prior Publication Data

US 2007/0188233 A1 Aug. 16, 2007

(30) Foreign Application Priority Data

Feb. 13, 2006 (DE) .................... 10 2006 006 568

(51) Int. Cl.
*H03F 3/26* (2006.01)
(52) U.S. Cl. ..................................... 330/276
(58) Field of Classification Search ............... 330/79, 330/188, 189, 276
See application file for complete search history.

(56) References Cited

U.S. PATENT DOCUMENTS 3,263,177 A * 7/1966 Durrett ..................... 330/9
4,255,769 A   3/1981 Naylor et al.
4,567,443 A   1/1986 Zwicky

FOREIGN PATENT DOCUMENTS

DE   30 23 151   1/1981
EP   0 157 187   5/1989

* cited by examiner

*Primary Examiner*—Steven J Mottola
(74) *Attorney, Agent, or Firm*—Schiff Hardin LLP

(57) ABSTRACT

An amplifier device including at least one operational amplifier, whereby a transformer is connected upstream from the input of the operational amplifier and the output signal of the operational amplifier or a signal generated from this output signal is fed back again to the input of the operational amplifier via a path with a predetermined resistance whereby the feedback signal is fed back before the input of the transformer whereby the transformer is designed or connected in a signal-inverting manner.

7 Claims, 3 Drawing Sheets

AMPLIFIER DEVICE INCLUDING AN OPERATIONAL AMPLIFIER, TRANSFORMER AND FEEDBACK LOOP

BACKGROUND OF THE INVENTION

1. Field of the Invention

The present invention concerns an amplifier device comprising at least one operational amplifier, whereby a transformer is upstream from the input of the operational amplifier and the output signal of the operational amplifier or a signal generated from this output signal is fed back again at the input of the operational amplifier via a path with a predetermined resistance.

2. Related Art

Operational amplifiers and amplifier devices with operational amplifiers are widely known in communications engineering, acoustics and sensor technology. In order to achieve an optimal signal transfer given the amplification, on the one hand an impedance adaptation must be effected. What is meant by impedance adaptation is the process of adapting the source impedance and the impedance of a load to one another since the power transfer is therewith maximized and reflections at the load are minimized. On the other hand, the noise factor N should be optimally minimized (also referred to as noise adaptation). This results from the quotient of the input signal-to-noise ratio (input SNR) and the output SNR and therewith indicates the reduction of the SNR. The current noise figure at $NF=10 \cdot \log N$ is calculated from the noise factor. Since the noise figure appears dependent on the source impedance offered to the operation amplifier, a common optimum for both quality criteria is not necessarily found in the design of the amplifier input circuit.

Two characteristics of the operation amplifier are thereby to be strongly differentiated. What is known as the small signal input resistance reflects the differential resistance between the two inputs of the operation amplifier and is infinitely large in the ideal case. In the impedance adaptation this resistance is adapted to the source impedance (mostly 50 Ohm). This is to be differentiated from what is known as the equivalent noise input resistance, which results from the quotient of the noise voltage density and the noise current density of the equivalent alternate sources of the operation amplifier. This quantity mostly lies in the $k\Omega$ range and is not a truly measurable resistance, but rather ultimately renders an adaptation value to other resistances in the system. An internal resistance of the source strongly deviating from this causes a high noise and therewith a high noise figure.

In the simplest known method for impedance adaptation, the input signal of the operation amplifier is connected to ground given a source impedance of $50\Omega$ via a further 50 Ohm resistor, whereupon an adaptation of the small signal input resistance is affected. However, a very large noise figure is generated since in typical amplifiers the equivalent noise input resistance lies in the $k\Omega$ range, such that the values deviate from one another by orders of magnitude and the termination resistance also supplies an additional noise contribution.

An amplifier device for simultaneous power and noise adaptation is proposed in the data sheet for operation amplifier CLC425 of the company National Semiconductor Corporation, 2900 Semiconductor Drive, Santa Clara, Calif., 95041 U.S.A (National Semiconductor CLC425 Ultra Low Noise Wideband Op Amp, 8 May 2001, available on the Internet). The adaptation to the source in particular is thereby achieved via a resistance feedback of the amplifier output signal to the amplifier input. This active manner of adaptation avoids the forced adaptation (described above) via the noise-plagued termination resistance at the amplifier input and thus leads to a reduced noise figure of the amplifier. For noise adaptation a transformer is connected upstream from the circuit. The signal inversion necessary for the negative feedback is realized in the proposed arrangement in the signal output path via an active function block (inverter). However, this amplifier device exhibits some disadvantages. Due to the use of the inverted a power loss occurs in the same, As an additional component the inverter also requires a certain space. Finally, as an active element the inverter itself represents a noise source, which further worsens the noise figure.

SUMMARY OF THE INVENTION

The present invention provides an amplifier device with an operational amplifier that enables an improved noise figure given simultaneous impedance adaptation. The amplifier device of the aforementioned type is inventively provided that the feedback signal is fed back before the input of the transformer, whereby the transformer is designed or connected such that it inverts the signal.

A simultaneous noise and impedance adaptation is also possible with the aid of this circuit via the simultaneous use of a transformer for noise adaptation and of a feedback path for impedance adaptation. In contrast to the prior art, however, the present invention proposes to effect the signal inversion passively (and therewith in a low-noise manner) via the transformer that is already used for noise adaptation. The signal inversion thus occurs in the signal input path. No signal inversion is thus provided on the feedback path; this only occurs via the transformer. The noise-generating and space- as well as power-intensive active inverter element as well as its noise are thus advantageously foregone. A further advantage of the inventive amplifier device is that the feedback to the amplifier input occurs across the transformer. The additional noise is thereby further minimized.

In a farther embodiment of the invention, two operation amplifiers can be provided that are controlled by the transformer fashioned for splitting of the signal into two partial signals, which operational amplifiers form a push-pull amplifier. This arrangement connects in a simple manner the cited advantages with those of a push-pull amplifier and is therefore particularly suitable for low-distortion applications whose usable frequency range extends across more than one octave. Examples for such amplifier devices are broadband amplifiers, intermediate frequency amplifiers or hi-fi audio amplifiers. A push-pull amplifier enables a suppression of the even-numbered distortion products (even-numbered harmonics). Each individual amplifier must additionally, respectively supply only half of the output power.

A second transformer for merging of the amplified partial signals can thereby be arranged downstream from the push-pull amplifier. In addition to the merging of the partial signals, via the variation of the conversion ratio the further transformer offers the advantage of a further degree of freedom in the optimization. The winding count of the first transformer is determined by the noise adaptation. Even given low amplification factors, a practicable conversion ratio of the input transformer can also be found via the additional degree of freedom without violating the requirement of an amplification factor $\geq 1$.

Since a power partition between both operational amplifiers occurs given a push-pull amplifier and the signal of the second operational amplifier exhibits a phase shift of 180°, the voltage curve of the partial signal at the output of the first operational amplifier corresponds to the voltage curve at the signal input path, such that it is possible to either only feed back an amplified partial signal or feed back to merged amplified partial signals, such that the second transformer is provided. The resistance in the feedback path must thereby possibly be dimensioned differently.

If the amplifier device should be directly connectable or connected to a symmetrically loadable device, a second transformer for merging of the signals is not necessary and an amplified partial signal (namely, depending on the winding direction of the input transformer, either that of the operational amplifier operating in a phase-shifted manner or that of the operation amplifier operating in a non-phase-shifted manner) can be fed back. The amplified partial signal that is not fed back is thereby advantageously connected to ground via a load resistor. An equal loading of both partial signal paths is thereby achieved.

Further advantages and details of the present invention result from the exemplary embodiments described in the following as well as using the drawings.

DETAILED DESCRIPTION OF THE PREFERRED EMBODIMENTS

Figure 1:
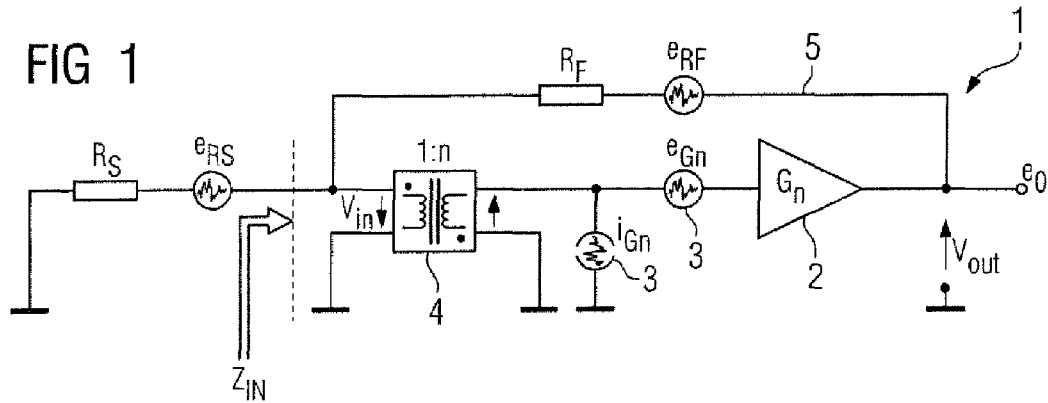
FIG. 1 is a circuit diagram of an inventive amplifier device according to a first exemplary embodiment with plotted equivalent noise sources.

FIG. 1 shows a circuit diagram of an amplifier device 1 according to a first exemplary embodiment of the present invention. An operational amplifier 2 (designated with its voltage amplification=$G_n$) is thereby provided whose equivalent noise sources 3 exhibit a noise voltage density $e_{Gn}$ or, respectively, noise current density $i_{Gn}$. The noise sources represent the departure of the practical device from an ideal device and to not represent actual elements in the circuit. For noise adaptation a transformer 4 designed with a winding count ratio of 1:n is connected upstream from the operational amplifier 2. As is easily determined from FIG. 1, if this is connected so as to be inverted, it thus additionally acts in a signal-inverting manner. From the output of the amplifier 2, the output signal is fed back over a path 5 with a predetermined resistance $R_F$ and its equivalent noise sources (designated with the noise voltage density $e_{RF}$) before the input of the transformer 4. The source impedance is designated with $R_S$; the noise voltage density of the associated equivalent noise source is designated with $e_{RS}$. The impedance compensation is effected in the level designated with $Z_{IN}$. If the noise voltage density $e_{Gn}$ and the noise current density $i_{Gn}$ are not dependent on the amplification $G_n$, mathematical expressions for the minimal noise figure $NF_{min}$ and the ideal winding ratio $n_{opt}$ of the transformer 4 can be specified exactly with the aid of the laws of electrical engineering. If the total amplification of the amplifier device 1 is designated with $G_v$, the minimal noise figure in the arrangement according to FIG. 1 yields:

$$NF_{min} = 10*\log\left(\frac{e_{Gn}*i_{Gn}}{k*T_0}+2\right)+10*\log\left(\frac{1+\frac{G_V}{2}}{1+G_V}\right) \quad \text{Equation (1)}$$

This minimal noise figure arises in:

$$n_{opt} = \sqrt{\frac{e_{Gn}}{i_{Gn}*\frac{R_S}{2}}}*\sqrt{\frac{1+\frac{G_V}{2}}{1+G_V}} \quad \text{Equation (2)}$$

Figure 2:
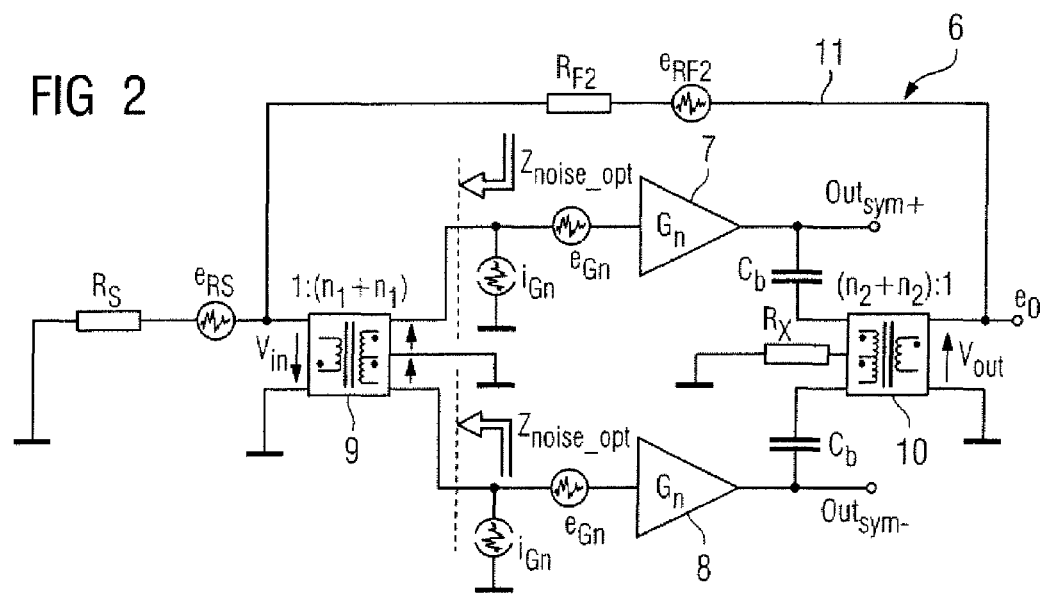
FIG. 2 is a circuit diagram of an inventive amplifier device according to a second exemplary embodiment as a push-pull amplifier with a second transformer and plotted equivalent noise sources.

With the amplifier device 6, FIG. 2 shows a second exemplary embodiment of the present invention wherein two similar operational amplifiers 7, 8 are controlled with the voltage amplification $G_n$ via the signal-splitting transformer 9 with the winding ratio 1($n_1$+$n_1$), such that a push-pull amplifier results. A second transformer 10 with the winding ratio ($n_2$+$n_2$):1 is provided for merging of the partial signals. The output signal of the second transformer 10 is fed back again via a path 11 with the resistance $R_{F2}$ before the first transformer 9. As is to be learned from FIG. 2, the first transformer 9 is in turn connected such that it inverts signals. The source impedance is again designated with $R_S$. The designation of the corresponding equivalent noise sources was also correspondingly adopted from FIG. 1. The resistor $R_x$ connected at the second transformer 10 consumes the power of the even-numbered harmonics and must be accordingly dimensioned.

Mathematical expressions for the minimal noise figure and the optimal winding ratio of the first transformer 9 can also be derived for the second exemplary embodiment with the assistance of the laws of electrical engineering. In the second exemplary embodiment $$NF_{min} = 10*\log\left(\frac{e_{Gn}*i_{Gn}}{k*T_0}+2\right)+10*\log\left(\frac{1+\frac{G_V}{2}}{1+G_V}\right) \quad \text{Equation (3)}$$

results in turn for the minimal noise figure.

The minimal noise figure arises given the following ideal winding count of the first transformer 9:

$$n_{opt} = \frac{1}{\sqrt{2}}*\sqrt{\frac{e_{Gn}}{i_{Gn}*\frac{R_S}{2}}}*\sqrt{\frac{1+\frac{G_V}{2}}{1+G_V}} \quad \text{Equation (4)}$$

Figure 3:
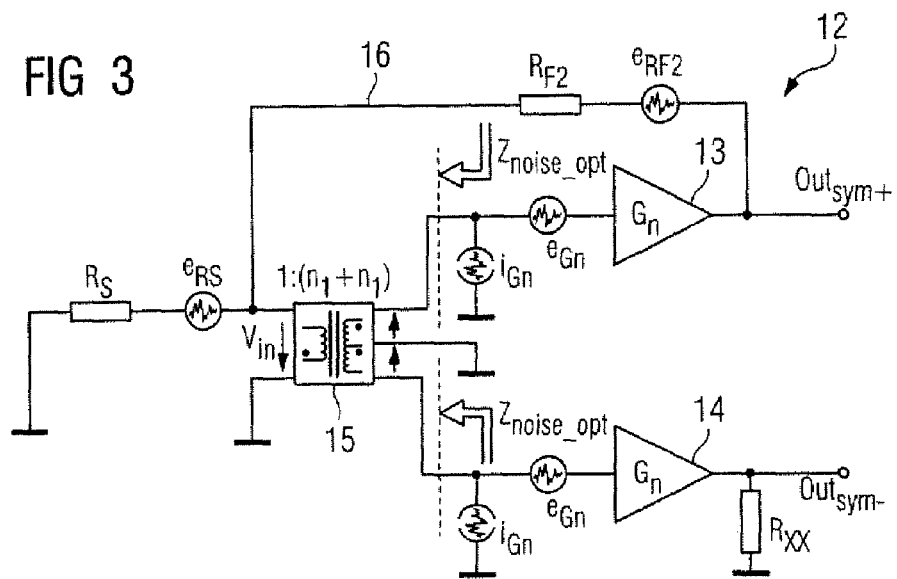
FIG. 3 is a circuit diagram of an inventive amplifier device according to a third exemplary embodiment in the embodiment as a push-pull amplifier for connection to a consumer load that can be fed symmetrically, with plotted equivalent noise sources.

With the amplifier device 12, FIG. 3 finally shows a simplified third exemplary embodiment with a push-pull amplifier for direct connection to a load that can be symmetrically fed. The second transformer is omitted here; the output of the upper operational amplifier 13 ($Out_{sym+}$) and the output of the lower operational amplifier 14 whose signal is phase-shifted by 180° ($Out_{sym-}$) directly serve as connections of the load that can be fed symmetrically. The remaining designations are the same as in FIG. 2. Here, however, the output signal of the upper operational amplifier 13 is directly fed back via the resistor $R_{F2}$ in the path 16 before the input of a transformer 15. In order to achieve a symmetrical loading of both operational amplifier outputs, the resistor RXX is additionally provided (which resistor $R_{XX}$ is correspondingly dimensioned). The same expressions that were already cited with equations (3) and (4) result for the minimal noise figure and the optimal ratio of the windings of the transformer 15.

Figure 4:
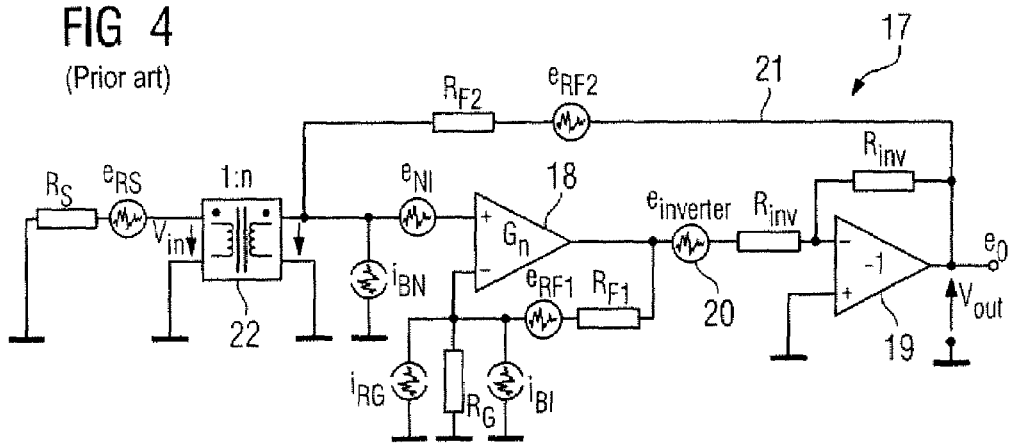
FIG. 4 is a circuit diagram of an amplifier device according to the prior art.

Serving for comparison, FIG. 4 shows the circuit diagram of an amplifier device 17 as it is described in the prior art regarding operational amplifier CLC425 according to the data sheet of the company National Semiconductor Corporation, 2900 Semiconductor Drive, Santa Clara, Calif., 95041 U.S.A. A further active element (an inverter 19) is thereby connected downstream from an operational amplifier 18. An equivalent noise source 20 generates the noise voltage density $e_{inv}$. The output signal of the inverter is fed back via a path 21 with a resistance RF with noise voltage density $e_{RF}$ before the input of the operational amplifier 18, thus after the transformer 22 provided for noise adaptation. The improvement that is achieved via the present invention relative to this disadvantageous prior art can be specified with the aid of factors a and b by which the noise power density NPD (caused by the noise voltage densities $e_{Gn}$ and $e_{RF}$) at the output of the amplifier is reduced.

These are functions of the voltage amplification $G_V$ and the transformer winding ratio n.

$$a = \frac{NPD\_e_{GN}}{NPD\_e_{GN\_National}} = \left( \frac{\left(1 + \frac{G_V}{2}\right) * \left(1 + \frac{G_V}{n}\right)}{\left(1 + \frac{G_V}{2*n}\right) * (1 + G_V)} \right)^2 \quad \text{Equation (5)}$$

From equation (5) it can be calculated at which voltage amplifications GV (a min) the factor a is minimal and which value it assumes there. Examples are to be learned from table 1, from which it can be recognized that the noise contribution is reduced.

TABLE 1

| n | $G_v$ (a min) [dB] | a |
|---|---|---|
| 1 | n.a. | 1 |
| 2 | 6.02 | 0.79 |
| 3 | 7.78 | 0.69 |
| 4 | 9.03 | 0.63 |
| 5 | 10 | 0.592 |

$$b = \frac{NPD\_e_{RF}}{NPD\_e_{RF\_National}} = \frac{1 + \frac{G_V}{n}}{(1 + G_V)}$$

results for the factor b.

As s easily to be recognized, the factor b goes small for large $G_V$ such as 1/n.

The total noise power density of the amplifier device results via a power-weighted addition of the individual contributions. The reduction of this value (and therewith of the noise figure) thus depends on the relative power distribution of the individual noise contributions. A generally valid or applicable specification of the noise figure reduction can therefore not be derived, especially as the noise contribution of the inverter 19 proposed in the prior art according to FIG. 4 plays an important role under the circumstances.

Figure 5:
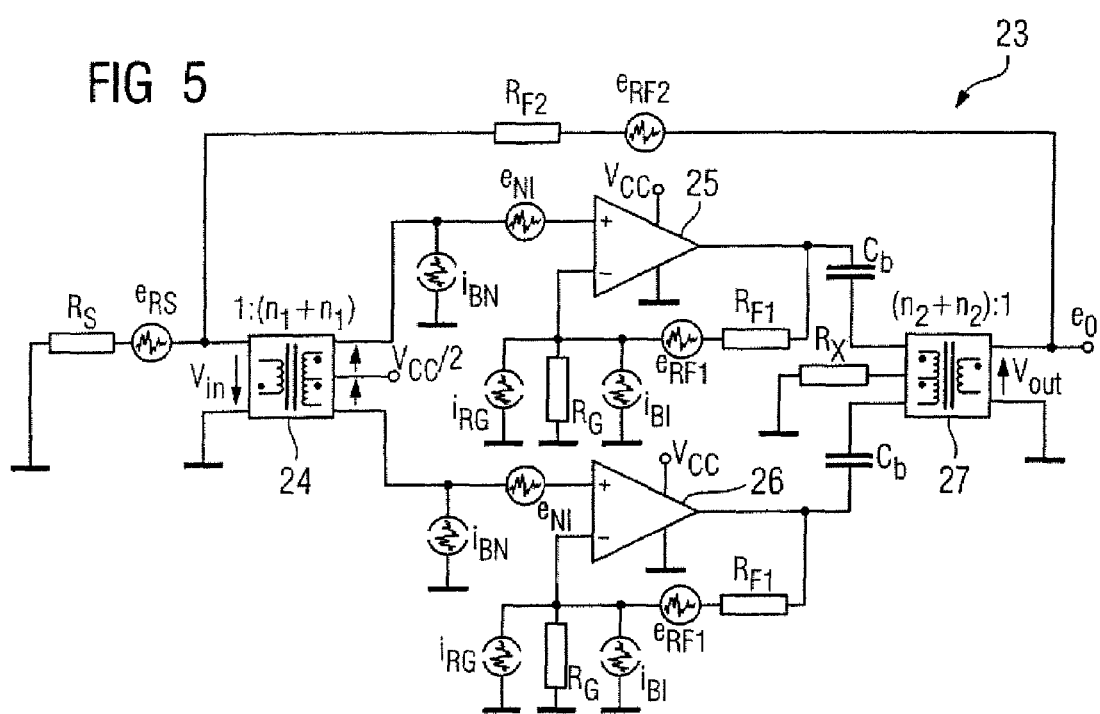
FIG. 5 is a complete alternate circuit diagram of an inventive push-pull amplifier device with a voltage amplification of 8 dB.

FIG. 5 shows the complete circuit diagram (inclusive of equivalent noise sources) for an amplifier device 23 according to a third exemplary embodiment of the present invention. It is a push-pull amplifier device with a total voltage amplification $G_V$=8 dB. The characteristics of the circuit are the following: $R_S$=50Ω, $G_V$=8 dB, NF=2.4 dB, $n_1$=3, $n_2$=2, $R_{F1}$=100Ω, $R_{F2}$=176Ω, $R_G$=148Ω.

In order to be able to realize the winding ratio $n_1$ in the first transformer 24 without violating the condition $G_n$=>1 (respective amplification of the individual apparatuses 25, 26), the voltage amplification that results solely due to the transformation must be decreased in that $n_2$=2 is selected for the second transformer 27. The voltage amplification of the operational amplifier 25, 26 then respectively amounts to $G_n$=4.5 dB.

Noise figures for a practical example can be calculated from the equations (1) and (3) as well as the corresponding equation for the circuit according to FIG. 4. Given an amplifier device with a voltage amplification of 8 dB and using a very low-noise operation amplifier (in the example the model AD 797 from Analog Devices, Inc., P.O. Box 9106, Norwood, Mass. 02062-9106 U.S.A.), the noise figures shown in table 2 result ($i_{Gn}$ and $e_{Gn}$ result from the corresponding data sheets of the AD 797).

TABLE 2

| | |
|---|---|
| First exemplary embodiment (FIG. 1) | NF = 4.0 dB |
| Third exemplary embodiment (FIG. 5) | NF = 2.4 dB |
| Prior art (FIG. 4) | NF = 6.8 dB |
| Prior art (FIG. 4), noise contribution of the inverter is negligible | NF = 4.8 dB |

In the calculation of the noise figure of the arrangement according to the prior art according to FIG. 4, a value of 100Ω was the basis for the resistance of the inverter 17. A further reduction of this value would have as a result a minimal reduction of the inverter noise contribution; the load of the operational amplifier would also thereby increase, which would have negative effects on the slew rate, the distortion of the output signal and the current consumption.

As arises from table 2, an advantage results even relative to the (naturally not realizable) variants in which a noise-free inverter would be used.

Thus, there is shown and described an amplifier device including at least one operational amplifier, whereby a transformer is connected upstream from the input of the operational amplifier and the output signal of the operational amplifier or a signal generated from this output signal is fed back again to the input of the operational amplifier via a path with a predetermined resistance whereby the feedback signal is fed back before the input of the transformer whereby the transformer is designed or connected in a signal-inverting manner.

Although other modifications and changes may be suggested by those skilled in the art, it is the intention of the inventors to embody within the patent warranted hereon all changes and modifications as reasonably and properly come within the scope of their contribution to the art.

We claim:

1. An amplifier device, comprising:
   at least one operational amplifier;
   a transformer connected upstream from an input of the operational amplifier; and
   a feedback loop to feed an output signal of the operational amplifier or a signal generated from the output signal back again to the input of the operational amplifier via a path with a predetermined resistance, said feedback loop feeding the signal back before an input of said transformer, said transformer being designed or connected in a signal-inverting manner.

2. An amplifier device, comprising:

at least one operational amplifier;

a transformer connected upstream from an input of the operational amplifier; and a feedback loop to feed an output signal of the operational amplifier or a signal generated from the output signal back again to the input of the operational amplifier via a path with a predetermined resistance, said feedback loop feeding the signal back before an input of said transformer, said transformer being designed or connected in a signal-inverting manner;

wherein said at least one operational amplifier includes two operational amplifiers that are controlled by said transformer fashioned for splitting of the signal into two partial signals, said two operation amplifiers being connected to form a push-pull amplifier.

3. An amplifier device according to claim 2, further comprising:

a second transformer for merging of amplified partial signals being connected upstream from the push-pull amplifier.

4. An amplifier device according to claim 2, wherein said feedback loop feeds only one amplified partial signal back.

5. An amplifier device according to claim 2, wherein said feedback loop feeds merged, amplified partial signals back.

6. An amplifier device according to claim 2, further comprising:

a device connected so that the amplified partial signals of the operational amplifiers can be connected or are connected directly to the device that is fed symmetrically and an amplified partial signal is fed back.

7. An amplifier device according to claim 4 further comprising:

a load resistor to ground connected to receive the amplified partial signal that is not fed back.

* * * * *